US006778031B2

(12) United States Patent
Baba et al.

(10) Patent No.: US 6,778,031 B2
(45) Date of Patent: Aug. 17, 2004

(54) HIGH-FREQUENCY CIRCUIT DEVICE USING SLOT LINE AND COMMUNICATION APPARATUS HAVING HIGH FREQUENCY CIRCUIT DEVICE

(75) Inventors: Takahiro Baba, Yokohama (JP); Koichi Sakamoto, Yokohama (JP); Shigeyuki Mikami, Yokohama (JP); Hiroyasu Matsuzaki, Yokohama (JP); Takatoshi Kato, Mino (JP); Yohei Ishikawa, Yokohama (JP); Koichi Takizawa, Hachioji (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 10/397,170

(22) Filed: Mar. 27, 2003

(65) Prior Publication Data

US 2004/0036542 A1 Feb. 26, 2004

(51) Int. Cl.[7] .................................................. H03B 5/18
(52) U.S. Cl. ............. 331/107 SL; 331/96; 331/107 DP
(58) Field of Search ...................... 331/107 SL, 107 DP, 331/117 FE, 107 S, 96; 333/247

(56) References Cited

U.S. PATENT DOCUMENTS

| 4,511,860 A | | 4/1985 | Bastida et al. | |
|---|---|---|---|---|
| 5,204,641 A | * | 4/1993 | Fiedziuszko et al. | ......... 331/96 |
| 5,821,827 A | * | 10/1998 | Mohwinkel et al. | .......... 331/99 |
| 5,983,089 A | | 11/1999 | Mohwinkel et al. | |
| 6,078,223 A | * | 6/2000 | Romanofsky et al. | ......... 331/9 |
| 6,661,315 B2 | * | 12/2003 | Iio | .............................. 333/219 |

FOREIGN PATENT DOCUMENTS

| EP | 55 127705 | 10/1980 |
|---|---|---|
| EP | 60 106205 | 6/1985 |

OTHER PUBLICATIONS

Roth B. et al., "Electronical Tunable Millimeterwave Oscillators in Slotline Techniques," International Journal of Infrared and Millimeter Waves, Plenum Publishing, New York, Aug. 1988, vol. 9, No. 8, p. 739–743.

Leverich W.K., et al., "FET Active Slotline Notch Antennas for Quasi–Optical Power Combining," IEEE Transactions on Microwave Theory and Techniques, IEEE Inc., New York, Sep. 1993, vol. 41, No. 9.

De Swardt, J.B., et al., "Slotline Coupled Varactor Turning of Voltage Controlled Oscillators," IEEE MTT–S Digest, May 1990, pp. 767–768.

Heinrich W., "Ths Slot Line in Uniplanar MMIC's: propagation characteristics and loss analysis," IEEE MTT–S Digest, May 1990, pp. 167–170.

* cited by examiner

*Primary Examiner*—Robert Pascal
*Assistant Examiner*—Joseph Chang
(74) *Attorney, Agent, or Firm*—Dickstein, Shapiro, Morin & Oshinsky, LLP.

(57) ABSTRACT

A high-frequency circuit device includes a substrate and a high-frequency circuit. The high-frequency circuit is provided on the substrate and has a signal line. The signal line is configured with a slot line provided by electrodes that are arranged side-by-side with a space therebetween on the substrate. The slot line can facilitates circuit design compared to a microstrip line and has significantly low conduction loss compared to a coplanar line, and can improve the Q-value of the high frequency circuit. This can provide an improved high-frequency circuit device having small phase noise. The high-frequency circuit device, which also serves as an oscillator, employs a slot output and thus can provide an advantage of better continuity for a class-B push-pull amplifier that operates more efficiently than a class-A one.

18 Claims, 15 Drawing Sheets

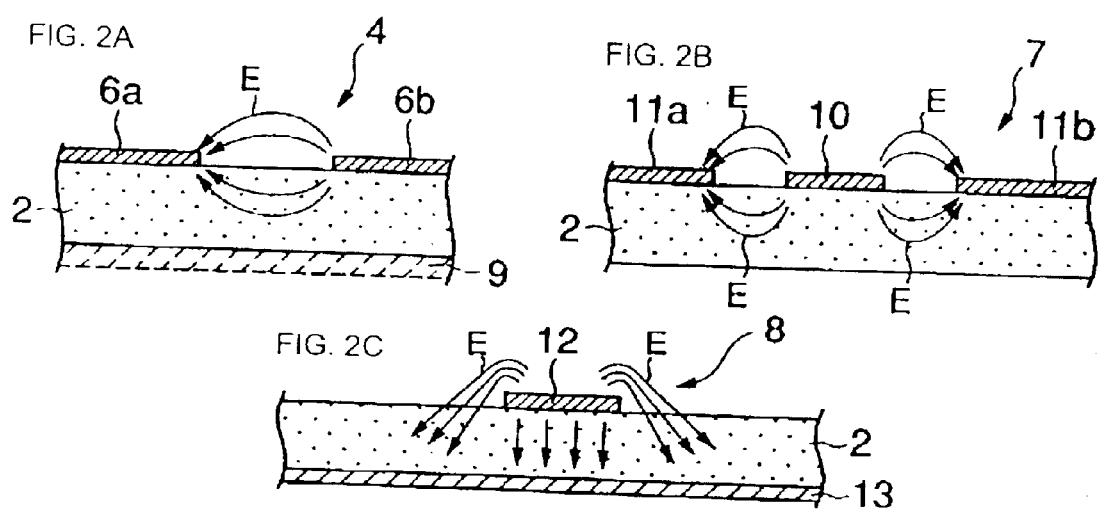

HIGH-FREQUENCY CIRCUIT DEVICE USING SLOT LINE AND COMMUNICATION APPARATUS HAVING HIGH FREQUENCY CIRCUIT DEVICE

BACKGROUND OF THE INVENTION

1. Field of the Invention

The present invention relates to a high-frequency circuit device, such as an oscillator, using a slot line, and to a communication apparatus having the high-frequency circuit device.

2. Description of the Related Art

For example, an oscillating circuit is available as a high-frequency circuit that is incorporated in a communication apparatus or the like. Attempts for reducing the phase noise have been made to improve the characteristic of the oscillating circuit. It is known that the phase noise can be reduced, for example, by increasing the Q-factor of the oscillating circuit. Accordingly, techniques for reducing the phase noise have been proposed by connecting a resonator to an oscillating circuit to thereby increase the Q-factor of the oscillating circuit (see non-patent document 1, as an example).

Non-patent Document 1: "Proceedings of 1994 IEICE (The Institute of Electronics, Information and Communication Engineers) Fall Conference", Funabashi et al., C-60

In this proposed oscillator (a high-frequency circuit device), for example, an oscillating circuit is provided on a substrate and a resonator, which is in the form of a chip component, is mounted on a surface of the substrate.

With the above proposed configuration, however, the positional accuracy for mounting the resonator on the substrate is poor, which poses a problem in that characteristic variations occur depending on each oscillator.

In addition, another configuration for an oscillator has been proposed (see non-patent document 2, as an example).

Non-patent Document 2: "Proceedings of 1998 Electronics Society Conference of IEICE", Ikematsu et al., C-2–15

In the document, a signal line in an oscillating circuit is formed of a microstrip line or coplanar line on a semiconductor substrate, and an FET (field effect transistor) element is formed, as an amplifying element, inside the semiconductor substrate. Further, a microstrip resonator or coplanar resonator is formed at the semiconductor substrate so as to provide a monolithic configuration.

In that configuration, the semiconductor substrate is used as the circuit board. To enhance the Q-factor of an oscillating circuit, it is preferable that a circuit board is made of material that is low in dielectric loss tan δ. However, there is no semiconductor material that has dielectric loss (tan δ) low enough to provide a satisfactory Q-factor. Thus, with the configuration of the proposed oscillator using a semiconductor substrate, an improvement in the Q-factor of an oscillating circuit has been limited.

SUMMARY OF THE INVENTION

Accordingly, the present invention has been made to overcome the above problems, and an object of the present invention is to provide an improved high-frequency circuit device whose Q-factor can be further reduced and whose phase noise can be substantially reduced and to provide a communication apparatus having the high-frequency circuit device.

To achieve the foregoing object, a first aspect of the present invention provides a high-frequency circuit device. The high-frequency circuit device includes a substrate and a high-frequency circuit provided on the substrate. The high-frequency circuit has a signal line, and the signal line is configured with a slot line provided by electrodes that are arranged side-by-side with a space therebetween on the substrate.

According to the present invention, a signal line included in a high-frequency circuit is provided by a slot line. As compared to a coplanar line for transmitting a high-frequency signal, a slot line can reduce conduction loss and also can easily prevent the generation of an unwanted wave. Thus, a slot line can enhance the Q-factor of a high-frequency circuit and can reduce the phase noise thereof. As a result, the use of a slot line can provide a high-frequency circuit device that has superior characteristics.

Meanwhile, a microstrip line, which is one type of transmission line for transmitting a high-frequency signal, is likely to have a parasitic component, which makes the circuit design difficult. In contrast, a slot line is less likely to generate a parasitic component, which can ease the difficulty of circuit design. Thus, a slot line is advantageous in terms of circuit design.

In addition, with a coplanar line or a microstrip line, the thickness of the substrate needs to be increased to enhance the Q-factor of a circuit, and thus the increased thickness of the substrate results in a problem of heat dissipation. In contrast, with a slot line, it is easy to enhance the Q-factor without increasing the thickness of the substrate, which can alleviate the problem of heat dissipation.

Preferably, a semiconductor element is provided along the slot line and is a surface-mounted component, which is mounted to the slot line on the substrate by using bumps. Since the slot line is provided using bumps, this arrangement can reduce the disturbance of an electromagnetic field at a portion where the slot line and the semiconductor are connected. This can reduce loss due to the leakage of an unwanted wave.

Additionally, the substrate, on which the high-frequency circuit is provided, is made of dielectric material. Thus, an appropriate selection of a dielectric material for constituting the substrate can substantially reduce the dielectric loss of the substrate and can significantly improve the Q-factor. That is, a decrease in conduction loss due to the use of a slot line and a decrease in dielectric loss due to the use of a dielectric substrate are combined to thereby significantly enhance the Q-factor of a high-frequency circuit. This arrangement, therefore, can easily provide a high-frequency circuit device that is superior in phase noise characteristic.

A slot line through which a high-frequency signal is transmitted may include a wide portion for reducing conduction loss. This arrangement can reduce the conduction loss in the slot line, can enhance the Q-factor of the circuit, and can reduce the phase noise.

The output portion of the high-frequency circuit may include a coplanar line. This arrangement facilitates the connection of a signal line to a subsequent circuit, since a signal line of a subsequent circuit connected to a high-frequency circuit device is configured with a coplanar line in many cases.

Preferably, the high-frequency circuit is an oscillating circuit, and a semiconductor element serving as an amplifying element is provided along the slot line. Configuring a signal line with a slot line can reduce the conduction loss of an oscillator circuit and thus can improve the Q-factor of the circuit. The use of a dielectric substrate for the substrate, on which the oscillating circuit is provided, facilitates a reduction in dielectric loss resulting from the substrate and thus can improve the Q-factor of the circuit. Since this arrangement allows the Q-factor to be enhanced as described above, it can provide an oscillating circuit whose phase noise is reduced.

A field effect transistor may be used for the amplifying element. The slot line is preferably provided by an inter-gate/source slot line, an inter-gate/drain slot line, and an inter-drain/source slot line, which form a feedback circuit. This arrangement provides a simple circuit configuration and can facilitate miniaturization of a high-frequency circuit device (an oscillator). The inter-gate/drain slot line is used to control the amount of feedback. Since the frequency of a feedback signal is controlled, this arrangement can suppress parasitic oscillation in the oscillating circuit and thus can improve the stability of the oscillation frequency of the oscillating circuit.

The gate-drain slot line that provides the feedback-amount controlling portion in the feedback circuit may have a short stub provided at a position of about $\lambda/4$ from a portion where the inter-gate/drain slot line, the inter-gate/source slot line, and the inter-drain/source slot line are interconnected. This arrangement facilitates the control of the amount of feedback and an oscillation frequency.

In addition, the substrate may have a resonator, which is connected to the oscillating circuit. This arrangement can further reduce phase noise in the oscillating circuit and can further stabilize the oscillation frequency of the oscillating circuit.

In addition, configuring the resonator with a conductor pattern can miniaturize the oscillator. Further, since the resonator and the slot line can be formed at the same time, it is possible to prevent a variation in the geometric relationship between the slot line and the resonator and to prevent a characteristic variation resulting therefrom. This arrangement, therefore, can improve the reliability of a product quality.

The resonator may be configured with a TE-mode plate resonator or a slot-line resonator. Since the use of such a resonator can easily improve the Q-factor of the resonator, it is possible to further improve the Q-factor and to achieve a reduction in phase noise.

Since a bipolar transistor has small low-frequency noise compared to a field effect transistor, it is possible to reduce phase noise.

The oscillating circuit may include an external-voltage-control-type variable-capacitance element. This arrangement allows the capacitance of the variable capacitance element to be variably controlled by an external voltage control, so that the capacitance of the variable capacitance element varies the oscillation frequency of the oscillating circuit. This allows for an external control of the oscillation frequency of the oscillating circuit.

When the resonator is provided, preferably, an external-voltage-control-type variable-capacitance element for variably controlling the resonant frequency of the resonator is connected to the resonator. Variably controlling the capacitance of the variable capacitance element with an external voltage can vary the resonant frequency of the resonator, which in turn can vary the oscillation frequency of the oscillating circuit. In this case, it is possible to widen the variable control range of the oscillation frequency of the oscillating circuit compared to a case in which the oscillating circuit includes the variable capacitance element.

Preferably, the substrate is made of dielectric material and has an f □ Q-factor of 50000 or more. This arrangement facilitates the Q-factor of the high-frequency circuit to be enhanced, and can reduce phase noise, as described above.

Another aspect of the present invention provides a communication apparatus that has the high-frequency circuit device using the slot line. Since the high-frequency circuit device of the present invention has improved performance, this arrangement stabilizes the operation of the communication apparatus and can improve the characteristics of the communication apparatus.

BRIEF DESCRIPTION OF THE DRAWINGS

FIGS. 2A, 2B, and 2C are sectional views illustrating the types of a line for transmitting a high-frequency signal;

DESCRIPTION OF THE PREFERRED EMBODIMENTS

Embodiments of the present invention will now described below with reference to the accompanying drawings.

Figure 1A:
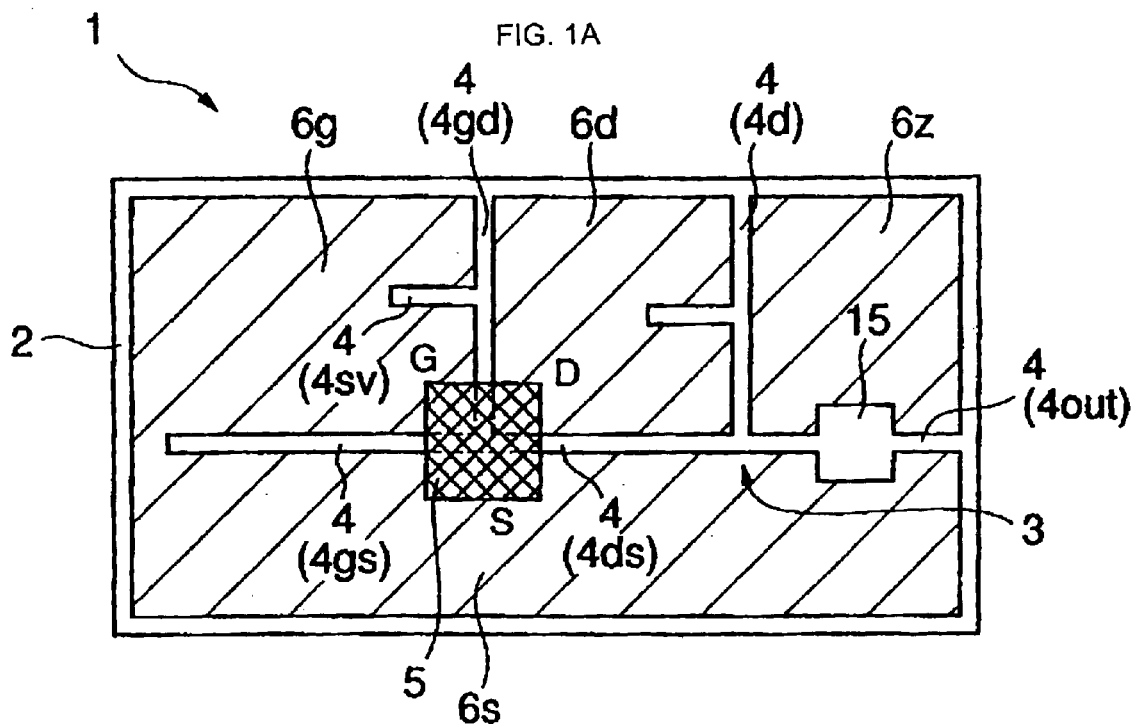
FIG. 1A is a plan view of a high-frequency circuit device (an oscillator) according to a first embodiment of the present invention and FIG. 1B is a circuit diagram thereof.
Figure 1B:
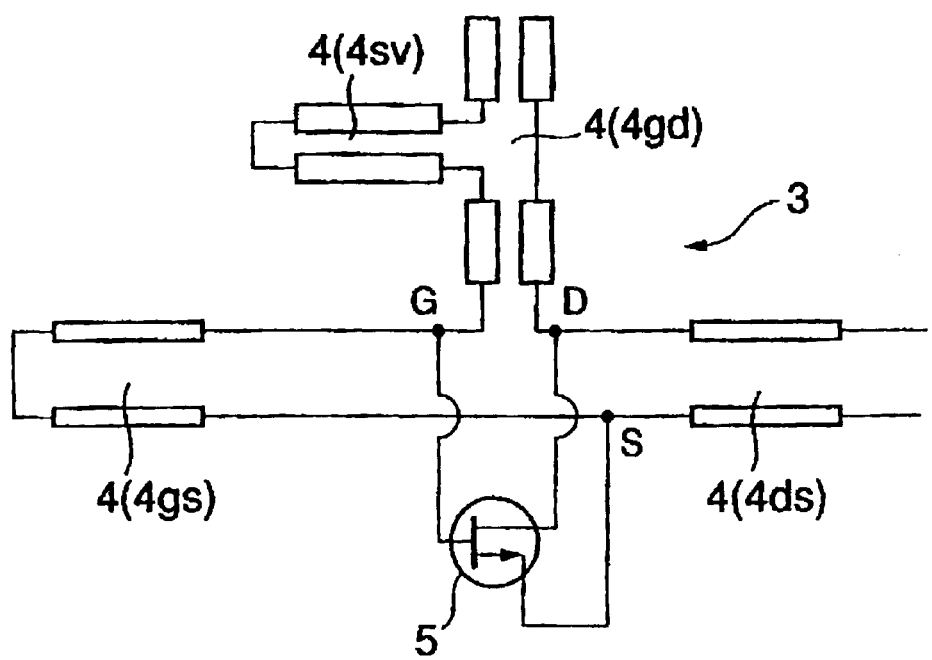

FIG. 1A is a plan view of an oscillator, which is a high-frequency circuit device according to a first embodiment of the present invention, and FIG. 1B is a circuit diagram thereof. An oscillator 1 of the first embodiment is constructed such that a substrate 2 is provided with an oscillating circuit 3.

In the first embodiment, the substrate 2 is made of dielectric material. The oscillating circuit 3 includes a slot line 4, which is a signal line provided on the substrate 2, and a field effect transistor (FET) 5, which is an amplifying element. The oscillating circuit 3 serves as a high-frequency circuit through which a high-frequency signal, such as a microwave signal or higher, passes. The FET 5 is a surface-mounted chip component, and a common-source FET is used therefor in the first embodiment. The FET 5 is mounted on a surface of the substrate 2 with gold (Au) bumps therebetween.

As shown in the schematic sectional view of FIG. 2A, for example, the slot line 4 is provided by electrodes 6a and 6b that are arranged on the substrate 2 side-by-side with a space therebetween. The slot line 4 transmits a signal while confining an electromagnetic field E between the electrodes 6a and 6b. Thus, the slot line 4 is suitable for the transmission of a high-frequency signal, such as a microwave signal or higher.

Several types of slot lines 4 are available. In one type, a ground electrode is not provided on the reverse side of the substrate 2. Other examples include a ground-conductor type in which a ground electrode 9 is formed on the reverse side of the substrate 2, as indicated by dotted lines in FIG. 2A, and a dual-sided slot structure type (which may be called a PDTL (Planar Dielectric Transmission Line)) in which slot lines are symmetrically formed on both the obverse and reverse sides of the substrate 2. In the first embodiment, the type of slot line 4 is not particularly limited, and any type of slot line 4 may be employed.

In the first embodiment, the substrate 2 has a gate-connecting electrode 6g, a source-connecting electrode 6s, and a drain-connecting electrode 6d. The gate-connecting electrode 6g, the source-connecting electrode 6s, and the drain-connecting electrode 6d are connected with the gate G, source S, and drain D of the FET 5, respectively. One edge of the gate-connecting electrode 6g and one edge of the drain-connecting electrode 6d are arranged side-by-side with a space therebetween, such that an inter-gate/drain slot line 4gd is provided. Another edge of the gate-connecting electrode 6g and the source-connecting electrode 6s are arranged side-by-side with a space therebetween, such that an inter-gate/source slot line 4gs is provided. Further, one edge of the drain-connecting electrode 6d and one edge of the source-connecting electrode 6s are arranged side-by-side with a space therebetween, such that an inter-drain/source slot line 4ds is provided. The inter-gate/source slot line 4gs, the inter-gate/drain slot line 4gd, and the inter-drain/source slot line 4ds are interconnected in a region where the FET 5 is mounted.

An electrode 6z is also provided on the surface of the substrate 2. One edge of the electrode 6z and the drain-connecting electrode 6d are arranged side-by-side with a space therebetween, such that a slot line 4d is provided. Further, another edge of the electrode 6z and the source-connecting electrode 6s are arranged side-by-side with a space therebetween, such that an outputting slot line 4out is provided.

The gate G, the source S, and the drain D of the FET 5 is connected, by using Au bumps or the like, to the gate-connecting electrode 6g, the source-connecting electrode 6s, and the drain-connecting electrode 6d, respectively. The FET 5 is provided along the slot line 4 in the oscillating circuit 3.

In the first embodiment, a gate-bias voltage is externally applied to the gate-connecting electrode 6g, a source-bias voltage is externally applied to the source-connecting electrode 6s, and a drain-bias voltage is externally applied to the drain-connecting electrode 6d. Then, when a signal is input from the inter-gate/source slot line 4gs to the FET 5, the input signal is amplified by the operation of the FET 5. The amplified signal is then output to the inter-drain/source slot line 4ds from the FET 5 and is output to the outside through the outputting slot line 4out. The output signal is partly fed back as an input signal to the FET 5 by using coupling between the drain-connecting electrode 6d and the gate-connecting electrode 6g. The feedback signal and the input signal strengthen each other and are amplified by the FET 5, and the resulting signal (an oscillation signal) is eventually output from the outputting slot line 4out.

That is, in the first embodiment, the inter-gate/source slot line 4gs, the inter-gate/drain slot line 4gd, and the inter-drain/source slot line 4ds constitute a feedback circuit in the oscillating circuit 3. The inter-gate/source slot line 4gs and the inter-drain/source slot line 4ds also have such lengths that the phase of the entire oscillating circuit 3 satisfies the phase condition of the oscillator 1. Further, the inter-gate/drain slot line 4gd and the slot line 4d serve to block direct current.

Additionally, the inter-gate/drain slot line 4gd provides a feedback-amount controlling portion for controlling the amount of feedback for the feedback circuit. That is, the inter-gate/drain slot line 4gd can variably control the degree of coupling between the gate-connecting electrode 6g and the drain-connecting electrode 6d. The variable control can be achieved by, for example, the line width (i.e., the distance between the gate-connecting electrode 6g and the drain-connecting electrode 6d), the presence/absence of a stub, and/or the formation position of the stub when it is formed. The degree of coupling between the gate-connecting electrode 6g and the drain-connecting electrode 6d determines the amount of feedback for the feedback circuit. Thus, the inter-gate/drain slot line 4gd is formed so as to provide an appropriate amount of feedback, considering, for example, a set oscillation frequency of the oscillator 1, and serves as a feedback-amount controlling portion. For example, with regard to the inter-gate/drain slot line 4gd, a short stub 4sv may be provided at a position of about $\lambda/4$ from the connection of the inter-drain/source slot line 4ds and the inter-gate/source slot line 4gs. This arrangement can facilitate the control of a frequency at which the amount of feedback is maximized. In addition, the provision of the short stub 4sv can suppress parasitic oscillation out of a predetermined oscillation frequency range since the frequency of the feedback signal is restricted.

In the first embodiment, an impedance converting portion 15, which has an increased line width, is provided between the inter-drain/source slot line 4ds and the outputting slot line 4out. The impedance converting portion 15 is used for coupling the inter-drain/source slot line 4ds and the outputting slot line 4out with such a low degree of coupling that amplification requirements are not disturbed.

Meanwhile, as a line for transmitting a high-frequency signal, a coplanar line 7 as shown in the sectional view of FIG. 2B or a microstrip line 8 as shown in the sectional view of FIG. 2C is available. The coplanar line 7 is a line that is arranged such that ground electrodes 11a and 11b sandwich a signal line 10, which is formed on a substrate 2, with spaces interposed therebetween. The microstrip line 8 is a line that is arranged such that a signal line 12 is formed on a substrate 2 and a ground electrode (conductor) 13 is formed on the reverse side of the substrate 2 to oppose the signal line 12. The slot line 4 is superior as a signal line for use in a high-frequency circuit for the following reasons, compared to the coplanar line 7 and the microstrip line 8.

Figure 3A:
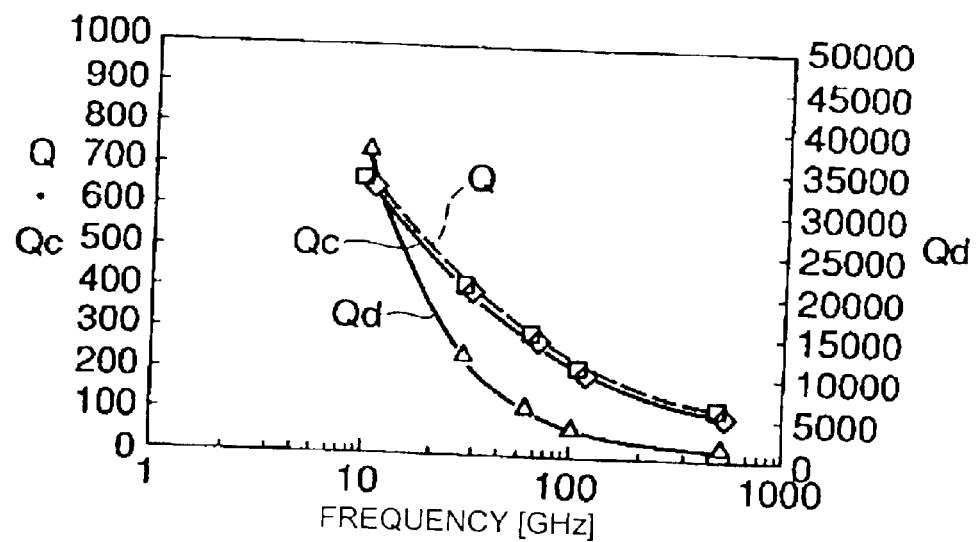
FIGS. 3A and 3B are graphs for comparison between a configuration with a slot line and a configuration with a coplanar, respectively, each graph showing a Qc value and a Q-factor which are closely associated with conduction loss.
Figure 3B:
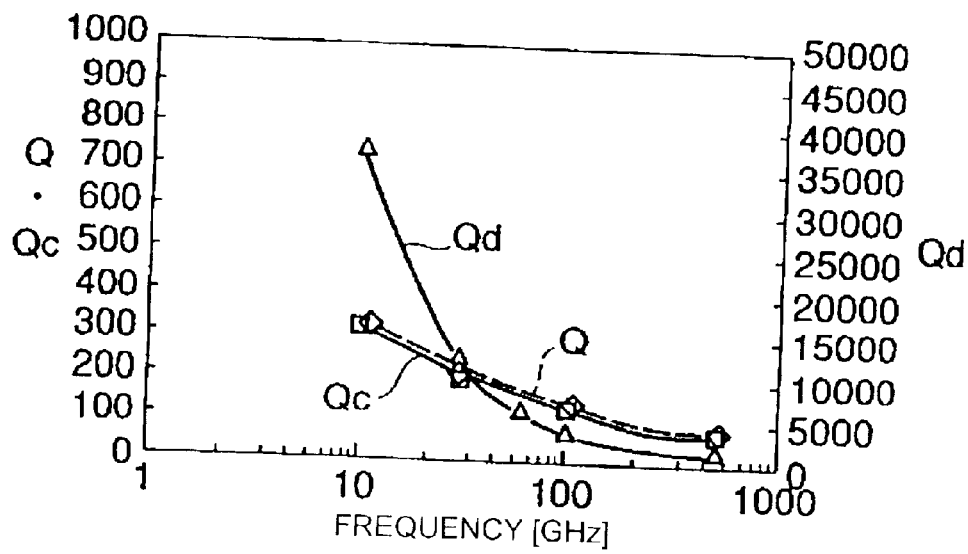

For example, the slot line 4 can substantially reduce the conduction loss of a signal compared to the coplanar line 7, which thus can improve the Q-factor. This is also seen from the result of simulation shown in FIGS. 3A and 3B. FIG. 3A is a graph showing an example of a Q-factor versus a signal frequency when the slot line 4 is used, and FIG. 3B is a graph showing an example of a Q-factor versus a signal frequency when the coplanar line 7 is used. In the simulation from which the examples of the Q-factor versus the signal frequency are obtained, conditions other than the difference of whether the signal line takes the form of the slot line 4 or the coplanar line 7 are substantially the same. For example, the calculation is performed under a condition that the inverses Qd of dielectric losses (tan δ) of the substrates 2, the dielectric losses being closely associated with the Q-factor, are equal (see solid lines Qd in the graphs) and values determined from multiplying the line widths by frequencies are constant.

Broken line Q shown in each of FIGS. 3A and 3B indicates a Q-factor, and solid line Qc indicates a Qc-factor, which is one factor for determining the Q-factor and is closely associated with conduction loss. As shown in the result of the simulation, the slot line 4 is superior in terms of conduction loss compared to the coplanar line 7.

Further, in order to configure a high-frequency circuit having a high Q-factor by using the coplanar line 7, the thickness of the dielectric substrate 2 needs to be increased. However, when a circuit is configured by mounting an element on the thick substrate 2, the increased thickness of the substrate 2 makes it difficult to dissipate heat, generated by the element and absorbed by the substrate 2, to the outside. This poses a problem of heat dissipation. In contrast, with the slot line 4, the Q-factor can easily be increased without increasing the thickness of the substrate 2. Thus, the thickness of the substrate 2 can be reduced while avoiding a decrease in Q-factor, which can prevent the problem of heat dissipation.

In addition, the coplanar line 7 is based on a symmetric operation with the signal line 10 at the center. Thus, the ideal condition is that electrodes 11a and 11b located at both sides of the signal line 10 have the same potential acting as a reference and a ground potential. For example, when a branching portion or the like is provided at either side of the electrodes 11a and 11b, the symmetry of the electromagnetic field E centering around the signal line 10 may be disturbed. In such a case, an unwanted wave is generated, thus causing the Q-factor to be reduced.

In contrast, the slot line 4 (including a ground-conductor type and a PDTL type) is based on a differential operation, and thus does not necessarily have to be provided with a ground electrode having a reference potential. Thus, the slot line 4 has fewer factors by which an unwanted wave is generated, and can suppress the generation of an unwanted wave. This makes it easy to prevent a decrease in the Q-factor which is due to an unwanted wave.

Further, the microstrip line 8 is analogous to the slot line 4 in terms of conduction loss, but requires the thickness of the dielectric substrate 2 to be increased as in the coplanar line 7. Thus, in the same manner described above, the problem of heat dissipation in an element mounted on the substrate arises.

In addition, with the microstrip line 8, ideally, the signal line 12 on the obverse side of the substrate 2 and the conductor 13 on the reverse side thereof are high-frequency connected with each other and the conductor 13 must serve as a ground electrode. When, however, the thickness of the substrate 2 is increased to enhance the Q-factor, a parasitic component is generated between the signal line 12 and the conductor 13. Thus, there is a problem in that the circuit design is difficult since the parasitic component must be taken into account. In particular, the circuit design becomes difficult for a high-frequency circuit using a semiconductor element to which a bias voltage needs to be applied.

In contrast, the slot line 4 neither requires the provision of a ground electrode nor requires an increased thickness of the substrate 2 to increase the Q-factor. Thus, as described above, the slot line 4 can suppress the generation of a parasitic component between the signal line and the ground electrode. This can ease the difficulty of circuit design.

Furthermore, when an element is mounted along the microstrip line 8 by using bumps, a through hole or the like connected to the microstrip line 8 has a large inductance component (L component). Thus, in this case, when the frequency of a signal passing through the microstrip line 8 is high, the ground electrode 13 for the microstrip line 8 deviates from its ideal condition. In this case, the microstrip line 8 may not be able to transmit a high-frequency signal in a satisfactory manner. Such a phenomenon is prominent for a signal having a frequency in a millimeter-wave band.

In contrast, as described above, the slot line 4 can eliminate the need to provide a ground electrode, and thus can rule out the problem resulting from such a ground electrode. Thus, the slot line 4 can transmit a high-frequency signal even in a millimeter wave band in a satisfactory manner.

As described above, the slot line 4 is superior as a transmission line for a high-frequency signal compared to the coplanar line 7 and the microstrip line 8.

Configuration of an oscillating circuit using the slot line 4 can significantly improve the Q-factor of the oscillator 1. For example, when an oscillator is configured using the microstrip line 8 or the coplanar line 7, the Q-factor of the oscillator becomes, for example, about 50 to 200. In contrast, when the oscillator 1 is configured using the slot line 4, the Q-factor of the oscillator 1 can be improved to, for example, about 300 to 600.

Figure 4A:
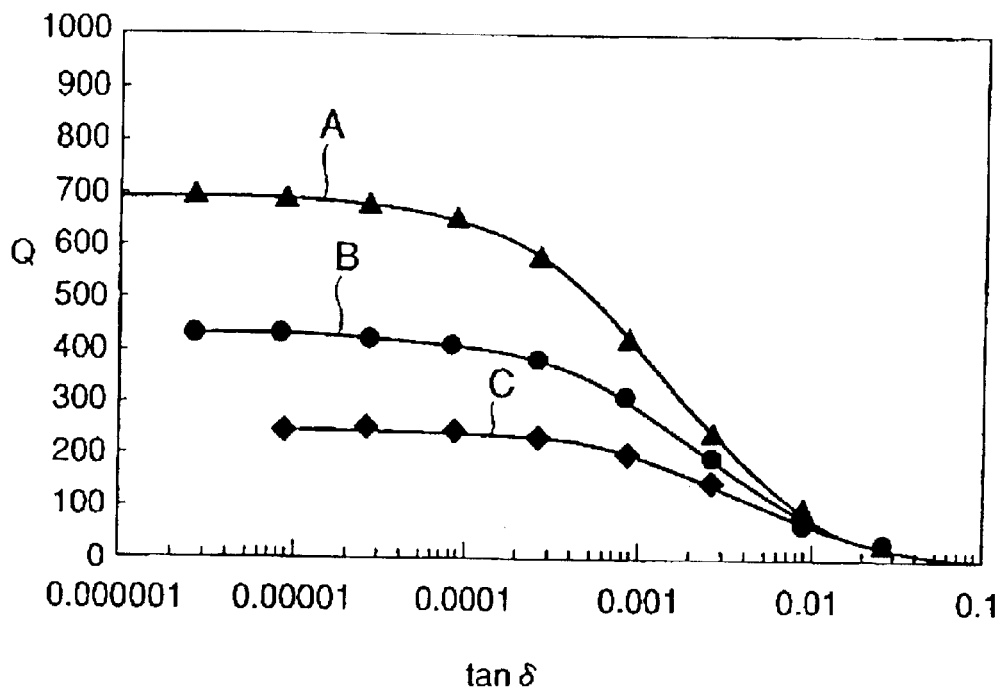
FIGS. 4A and 4B are graphs each illustrating an example of the dielectric loss (tan δ) of a substrate versus the Q-factor.

Also, not only the conduction loss of the signal line but also the dielectric loss (tan δ) of the substrate 2 is closely associated with the Q-factor of the oscillating circuit 3. For example, FIG. 4A is a graph showing an example of the dielectric loss (tan δ) of the substrate 2 versus the Q-factor of the oscillating circuit 3. This example of the relationship was obtained from a simulation. Solid line A indicates a case for a signal frequency of 10 GHz, solid line B indicates a case for a signal frequency of 30 GHz, and solid line C indicates a case for a signal frequency of 100 GHz. In the simulation, the slot line 4 is used for the signal line, and the calculations were performed under a condition that a value determined from multiplying the line width by the signal frequency is constant.

According to the result of the simulation, the dielectric loss (tan δ) of semiconductors is in the range of about 0.001 to 0.01, but some of dielectric materials have a dielectric loss (tan δ) smaller than 0.001. Thus, configuring the substrate 2 with a dielectric material having a dielectric loss (tan δ) smaller than 0.001 can improve the Q-factor of the oscillating circuit 3 compared to a case in which the substrate 2 is made of semiconductor material.

In the first embodiment, for example, an appropriate dielectric material for the substrate 2 is selected as described below. For example, as shown in the result of the simulation, as the dielectric loss (tan δ) of the substrate 2 decreases, the Q-factor of the oscillating circuit 3 increases. Also, when the dielectric loss (tan δ) of the substrate 2 decreases by some degree, the Q-factor of the oscillating circuit 3 is substantially stabilized to a constant value in accordance with a signal frequency. When only the dielectric loss (tan δ) of the substrate 2 is taken into account, it is sufficient to select a dielectric material having a small dielectric loss (tan δ) that can provide its maximum Q-factor, as a material for constituting the substrate 2. However, in practice, a dielectric material for constituting the substrate 2 cannot be selected by only a dielectric loss (tan δ) and thus should be selected by considering various factors including the ease of manufacture and cost. For this reason, for example, a permissible lower-limit decreasing-rate for a Q-factor is determined with respect to the maximum of the Q-factor for each signal frequency. Then, a dielectric material having a dielectric loss (tan δ) is selected such that the decreasing rate of a Q-factor with respect to the maximum of the Q-factor for each signal frequency is within the determined permissible lower-limit decreasing rate.

Figure 4B:
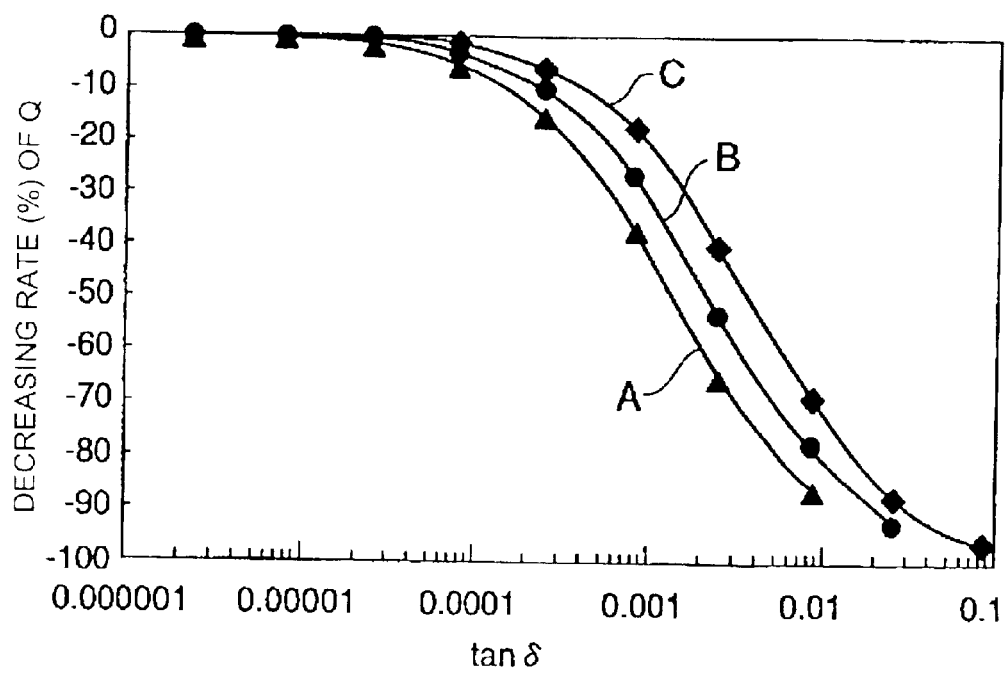

Specifically, for example, based on the result of the simulation shown in FIG. 4A, an example of a dielectric loss (tan δ) versus the decreasing rate of a Q-factor with respect to the maximum of the Q-factor for each signal frequency can be obtained, as shown in FIG. 4B. When the permissible lower-limit decreasing rate of the Q-factor with respect to the maximum of the Q-factor is specified as 10%, for example, a dielectric material having a dielectric loss (tan δ) of 0.00014 or less is employed as a material for constituting the substrate 2 for a signal frequency of 10 GHz (see solid line A), in accordance with FIG. 4B. Also, for a signal frequency of 30 GHz (see solid line B), a dielectric material having a dielectric loss (tan δ) of 0.00028 or less is employed as a material for constituting the substrate 2. Further, for a signal frequency of 100 GHz (see solid line C), a dielectric material having a dielectric loss (tan δ) of 0.00047 or less is employed as a material for constituting the substrate 2.

Meanwhile, "f×Q-factor" is available as one index representing a characteristic of the substrate 2. The f×Q-factor is determined from multiplying the frequency f of a signal by Qd (Qd=1/tan δ) that is the inverse of a dielectric loss (tan δ). With the f×Q-factor, for example, when the permissible lower-limit decreasing rate of the Q-factor with respect to the maximum of the Q-factor is specified as 10%, a dielectric material having an f×Q-factor of about 70000 or more is employed as a material for constituting the substrate 2, for a signal frequency of 10 GHz. Also, for a signal frequency of 30 GHz, a dielectric material having an f×Q-factor of about 100000 or more is employed as a material for constituting the substrate 2. Further, for a signal frequency of 100 GHz, a dielectric material having an f×Q-factor of about 200000 or more is employed as a material for constituting the substrate 2. In the first embodiment, since it is intended that a high-frequency signal in a microwave band or higher is transmitted, a dielectric material having an f×Q-factor of about 50000 or more is preferably employed to improve the Q-factor.

In the first embodiment, as described above, the slot line 4 is employed as the signal line for the oscillating circuit 3 to reduce conduction loss of a high-frequency signal. In addition, a dielectric substrate is used for the substrate 2, so that a dielectric material having a small dielectric loss (tan δ) which can provide a high Q-factor can be selected as a material for constituting the substrate 2. In this manner, this arrangement can substantially reduce both conduction loss and dielectric loss, which makes it possible to significantly increase the Q-factor of the oscillator 1 compared to known oscillators. This can, therefore, provide an improved oscillator 1 having less phase noise.

Additionally, the arrangement in the first embodiment is very simple and thus can achieve miniaturization of the oscillator 1. For example, when the frequency of a signal passing through the oscillating circuit 3 is set to 30 GHz and the relative dielectric constant of the substrate 2 is set to 24, the substrate 2 can be sized approximately to have a thickness of 0.6 mm, a length of 8 mm, and a width of 5 mm. Since the FET 5 is also a thin chip component, it is possible to reduce the thickness of the oscillator 1.

In addition, since the oscillator 1 in the first embodiment employs a slot output, an advantage of better continuity for a class-B push-pull amplifier that operates more efficiently than a class-A one can be provided.

A second embodiment of the present invention will now be described. In the description of the second embodiment, similar elements as those in the first embodiment are denoted with the same reference numerals and the descriptions thereof are omitted.

Figure 5:
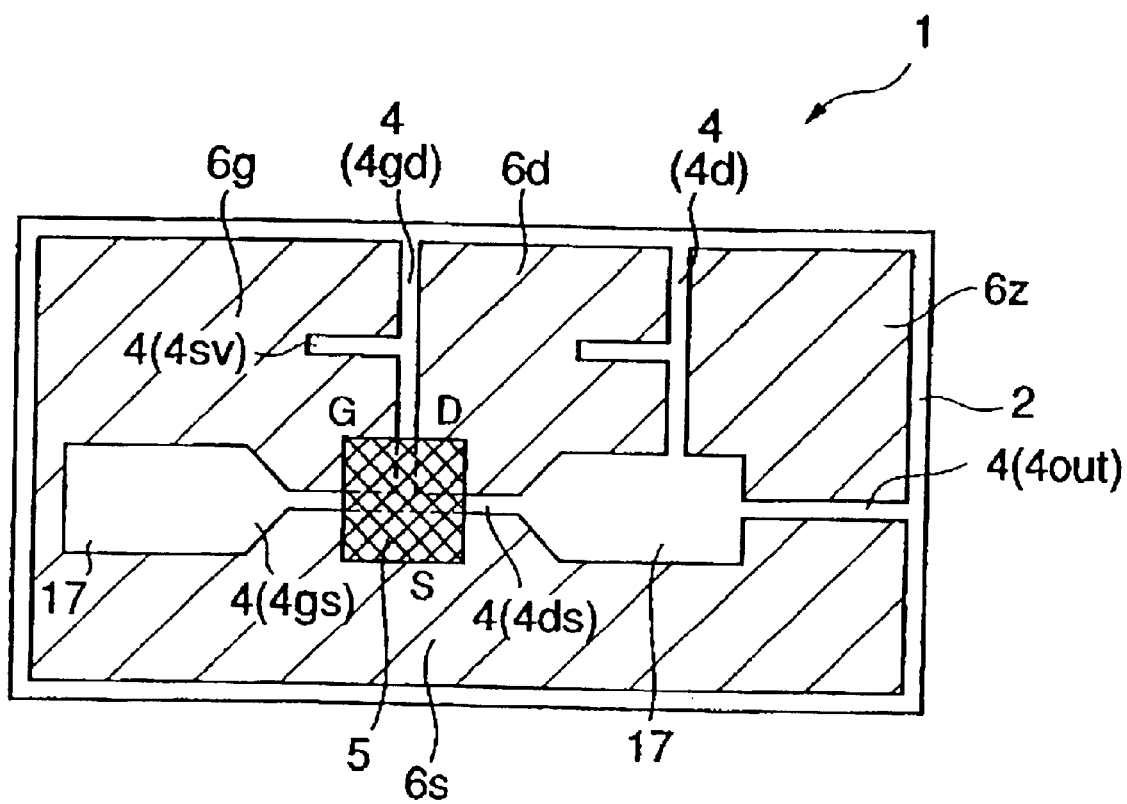
FIG. 5 is a plan view illustrating a high-frequency circuit device according to a second embodiment of the present invention.

In the second embodiment, as shown in FIG. 5, wide portions 17 are provided at parts of a slot line through which a high-frequency signal passes, i.e., at parts from the slot line 4gs to the outputting slot line 4out through the slot line 4ds. Since increasing line widths in this manner can reduce conduction loss, this arrangement can further improve the Q-factor of the oscillating circuit 3. Configurations other than the wide portions are substantially the same as those in the first embodiment.

In this case, the line width of the outputting slot line 4out is determined by considering a signal line of a subsequent circuit connected to the output portion of the oscillator 1. Thus, in the second embodiment, the line width is restricted by the subsequent circuit. However, for example, when the line width of the outputting slot line 4out is not restricted by the configuration of a subsequent circuit, the line width of the outputting slot line 4out may also be increased. Also, in the second embodiment, the line width of the slot line 4 formed in a region where the FET 5 is mounted is designed according to a signal-inputting slot line and a signal-outputting slot line which are formed at the FET 5.

A third embodiment of the present invention will now be described. In the description of the third embodiment as well, similar elements as those in the first and second embodiments discussed above are denoted with the same reference numerals, and the descriptions thereof are omitted.

In the third embodiment, as shown in FIGS. 6 to 9, the oscillator 1 has a resonator 18 in addition to each configuration of the first and second embodiments. The resonator 18 is provided by a conductor pattern on the substrate 2. Configurations other than the configuration of the resonator 18 are analogous to those in each embodiment described above.

Figure 6:
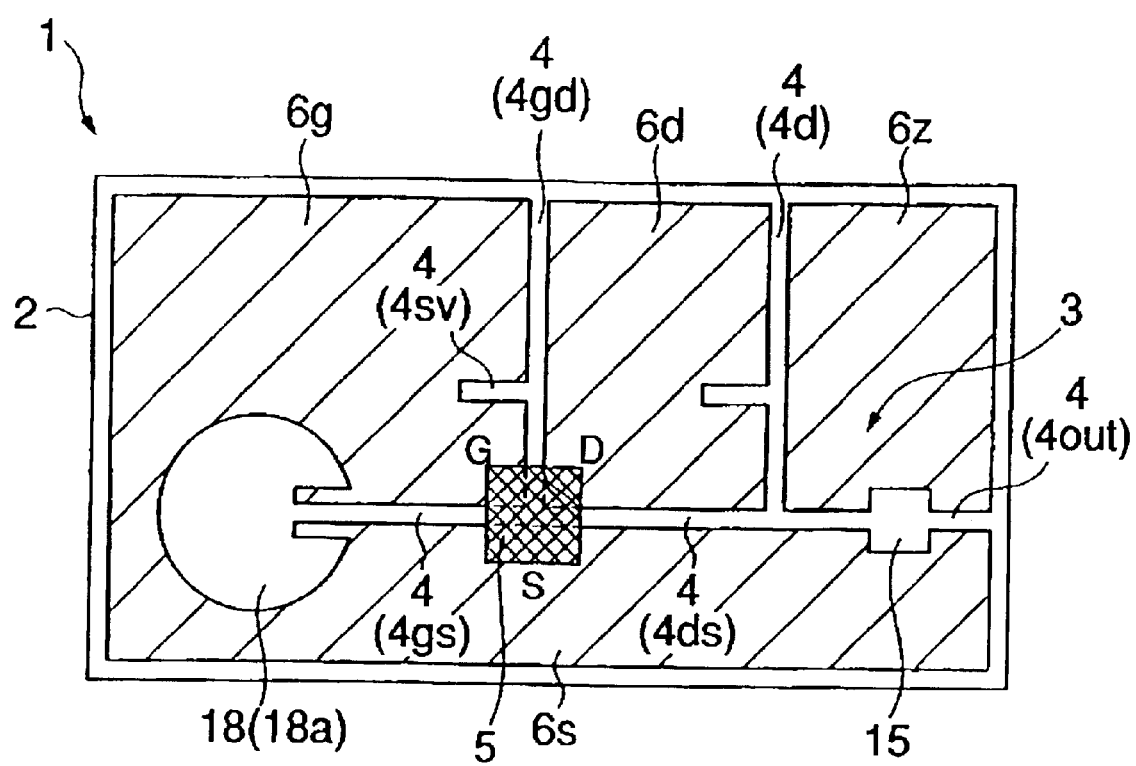
FIG. 6 is a plan view illustrating one example in which a resonator is connected to an oscillating circuit.
Figure 7:
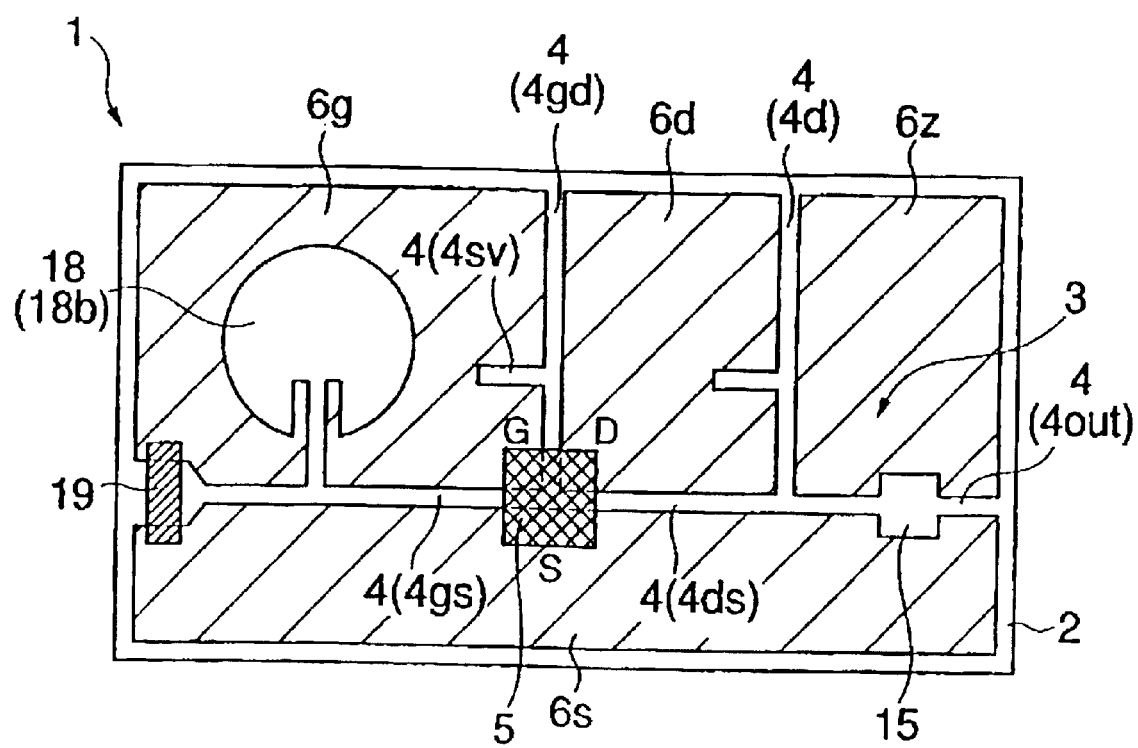
FIG. 7 is a plan view illustrating another example in which a resonator is connected to the oscillating circuit.

The resonator 18 (18a) shown in FIG. 6 is a reflective TE010-mode plate resonator, and is connected to one end of the inter-gate/source slot line 4gs. The resonator 18 (18b) shown in FIG. 7 is a reactive TE010-mode plate resonator, and is connected into the inter-gate/source slot line 4gs. Reference numeral 19 in FIG. 7 indicates a chip component serving as a terminating resistor. When the reactive TE010-mode plate resonator 18 (18b) is connected as shown in FIG. 7, the phase condition of the oscillator 1 can be determined by regarding the connection of the resonator 18 (18b) as being substantially open.

Figure 8:
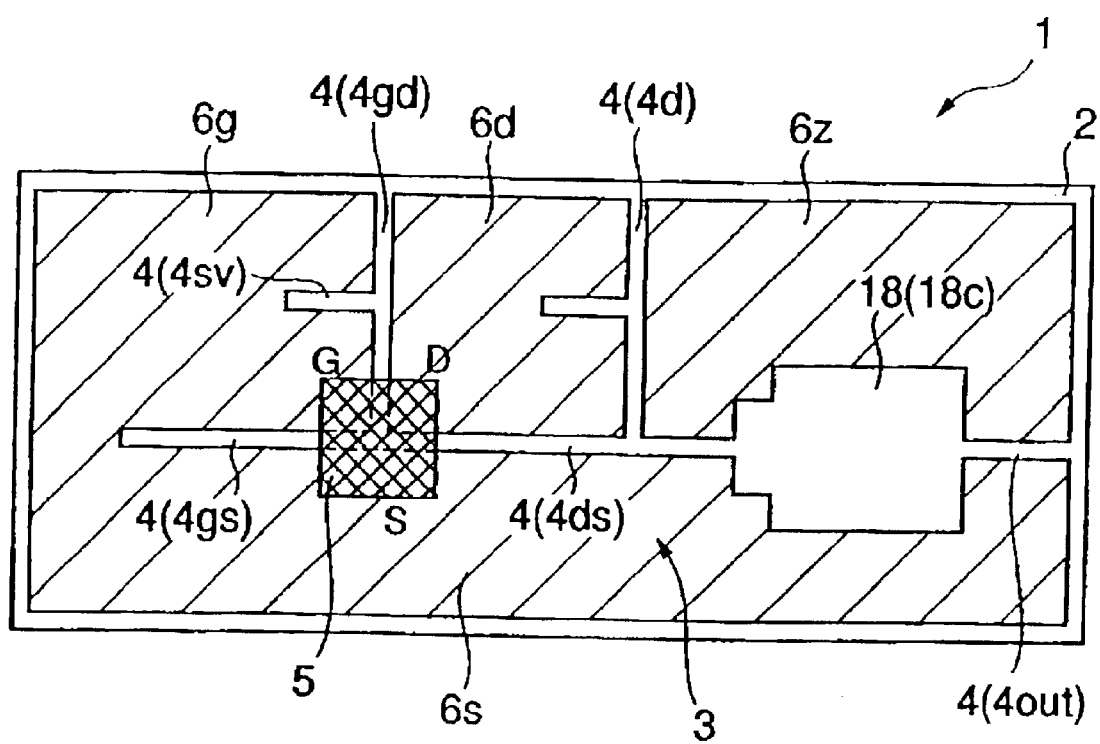
FIG. 8 is a plan view illustrating yet another example in which a resonator is connected to the oscillating circuit.
Figure 9:
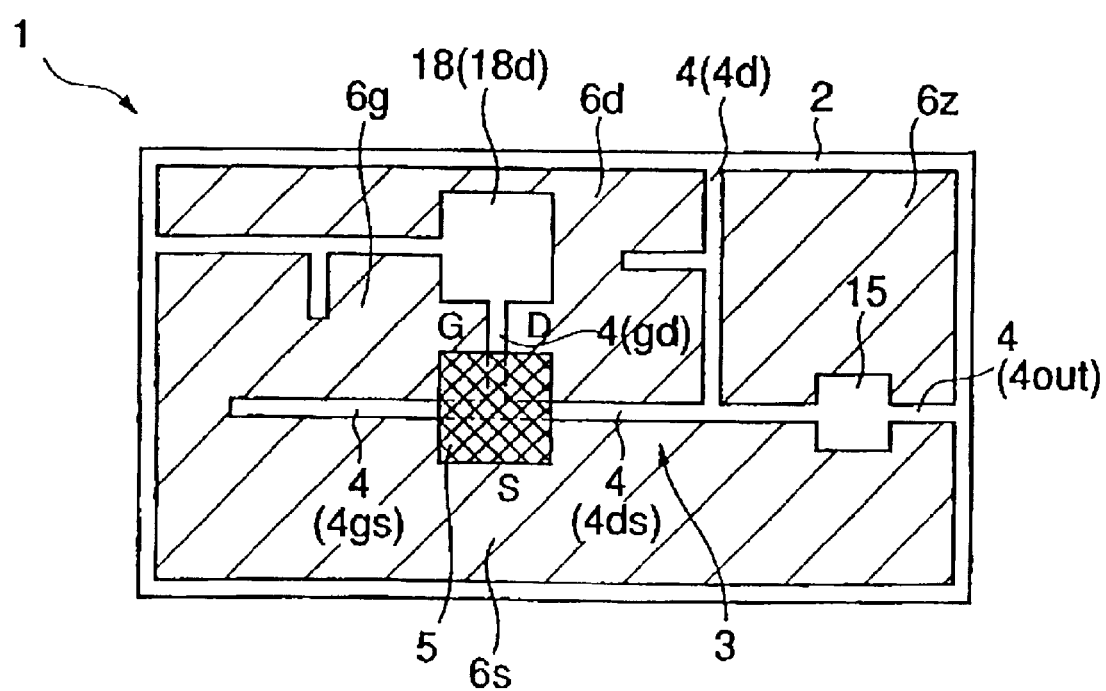
FIG. 9 is a plan view illustrating still another example in which a resonator is connected to the oscillating circuit.

In addition, the resonator 18 (18c) shown in FIG. 8 is a transmission slot resonator, and is provided between the inter-drain/source slot line 4ds and the outputting slot line 4out. In this example, the slot resonator 18c is of a PDTL type in which conductor patterns for the resonator are symmetrically formed on both the obverse and reverse sides of the substrate 2. Additionally, the resonator 18 (18d) shown in FIG. 9 is a reflective slot resonator, and is provided along the inter-gate/drain slot line 4gd. In this case, the resonator 18d is a part of a feedback circuit. In this example, the resonator 18d is also of a PDTL type, similarly to the resonator 18c shown in FIG. 8.

In the third embodiment, since the resonator 18 is connected to the resonator circuit 3, it is possible to further reduce phase noise in the oscillating circuit 3. Meanwhile, low-frequency parasitic oscillation is likely to occur due to the general property of the FET 5. However, since the resonator 18 can regulate the oscillation frequency of the oscillating circuit 3 within a set frequency range, it is possible to reduce the occurrence of low-frequency parasitic oscillation. This arrangement, therefore, can further stabilize the oscillation frequency of the oscillating circuit 3. Thus, this arrangement can offer an oscillator 1 that has smaller phase noise and that provides a highly stable oscillation frequency.

In addition, in the third embodiment, the resonator 18 is provided by a conductor pattern formed on the substrate 2. This allows the resonator 18 to be formed at the same time as when the slot line 4 is formed on the substrate 2. As a result, for example, as compared to a case in which the resonator is a surface-mounted component, the third embodiment can simplify the manufacturing process and can also improve the commercial productivity since it can eliminate the process of mounting the resonator on the substrate 2.

Also, when the resonator is a surface-mounted component, the mounting position of the resonator is likely to vary since it is difficult to accurately mount the resonator at a position where the slot line 4 is laid down. This may cause a problem in that the characteristics of the oscillator 1 vary in each case. In contrast, in the third embodiment, the slot line 4 and the resonator 18 are simultaneously fabricated by a film-making technique. Thus, variations in the geometric relationship between the slot line 4 and the resonator 18 can be suppressed, which can prevent the problem of characteristic variations resulting from the arrangement of the slot line 4 and the resonator 18. This, therefore, can reduce the performance variation and can enhance the reliability of the oscillator 1.

In the examples shown in FIGS. 6 to 9, while the line width of the slot line 4 is substantially equal, a wide portion or portions 17 may also be provided at parts of the slot lines (i.e., the slot lines 4gs, 4ds, and 4out) through which a high-frequency signal passes. The provision of the wide portion 17 can reduce conduction loss and can further improve the Q-factor of the oscillating circuit 3.

A fourth embodiment of the present invention will now be described. In the description of the fourth embodiment, similar elements as those in the first to third embodiments are denoted with the same reference numerals and the descriptions thereof are omitted.

Figure 10:
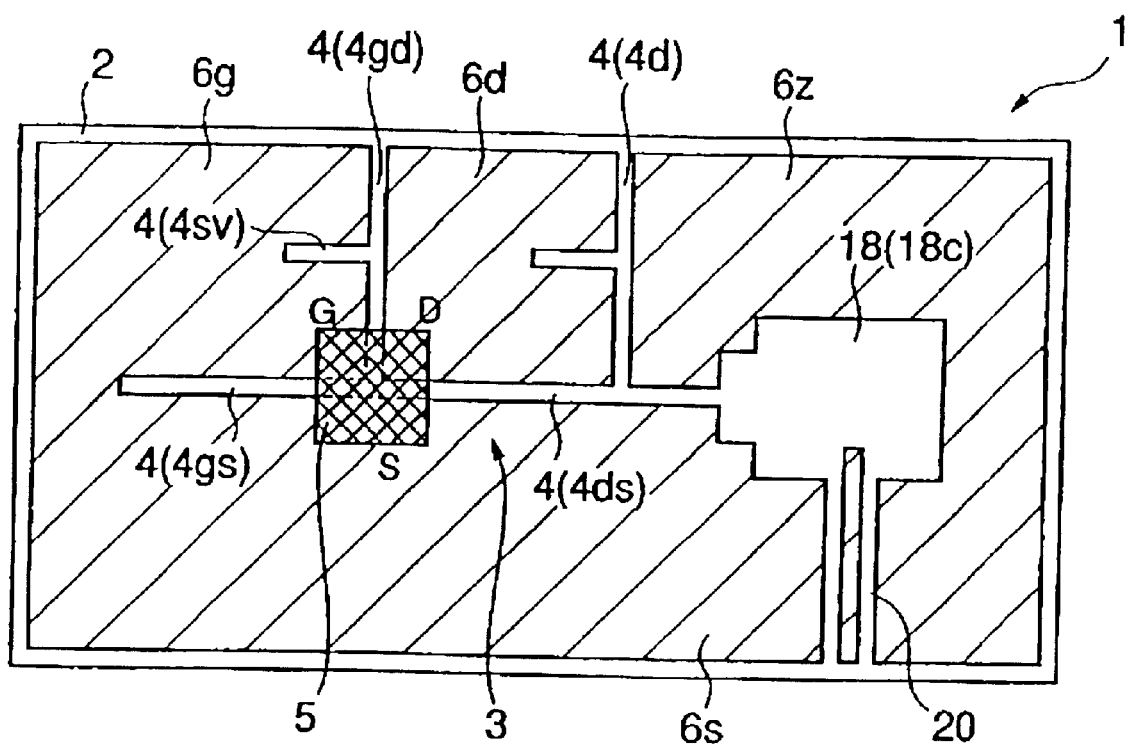
FIG. 10 is a plan view illustrating one example in which a coplanar line is provided as a signal line for the output portion of the oscillating circuit.

In the fourth embodiment, instead of the slot line 4out, as shown in FIG. 10, an outputting coplanar line 20 is provided as a signal line for the output portion. In many cases, for a subsequent circuit connected to the output portion of the oscillator 1, a coplanar line is used as a signal line for transmitting a high-frequency signal. Thus, the use of the coplanar line 20 for the signal line of the output portion can facilitate the connection of the signal line between the oscillator 1 and the subsequent high-frequency circuit.

While FIG. 10 illustrates one example of the oscillating circuit 3 in which the signal line (the outputting slot line 4out) for the output portion in the oscillating circuit 3 shown in FIG. 8 is replaced by the outputting coplanar line 20, naturally, the outputting slot line 4out in the oscillating circuit 3 shown in FIGS. 1, 5, 6, 7, or 9 may also be substituted by the outputting coplanar line 20.

A fifth embodiment of the present invention will now be described. In the description of the fifth embodiment, similar elements as those in the embodiments discussed above are denoted with the same reference numerals and the descriptions thereof are omitted.

Figure 11:
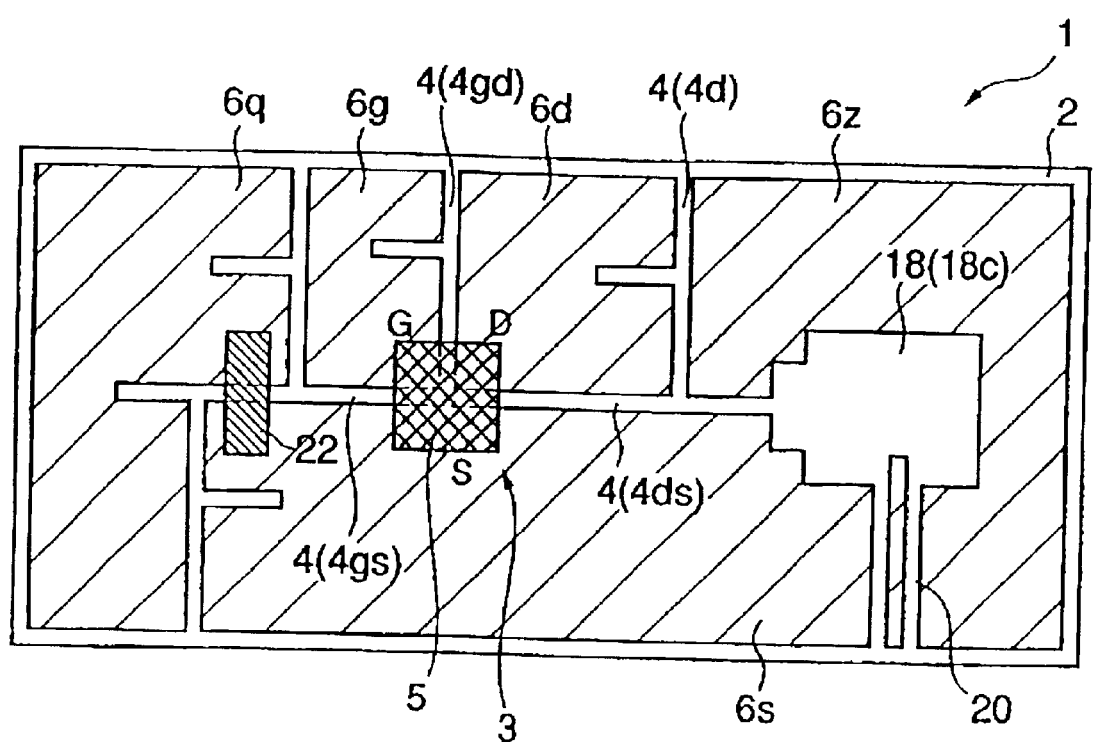
FIG. 11 is a plan view illustrating one example in which a variable capacitance element is connected to the oscillating circuit.
Figure 12:
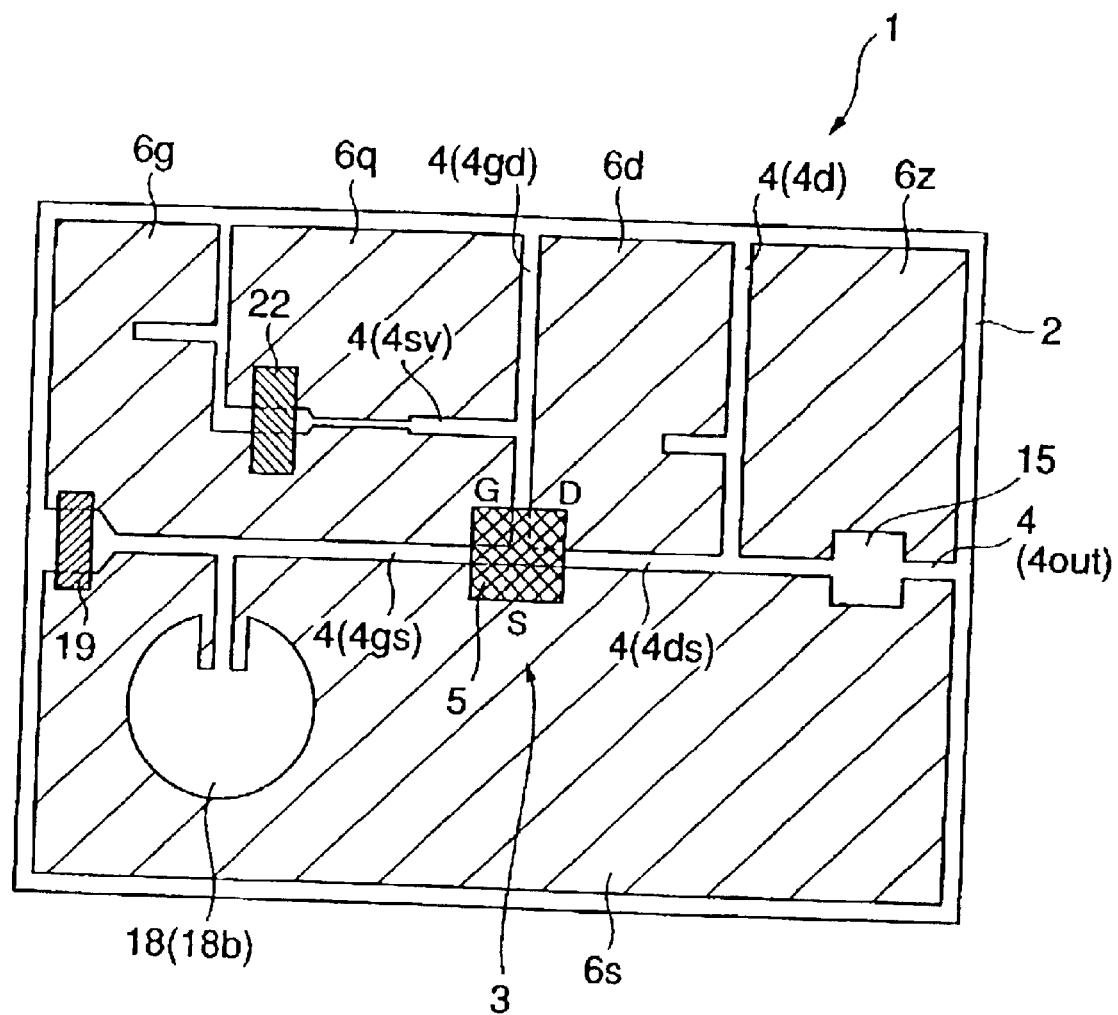
FIG. 12 is a plan view illustrating yet another example in which the variable capacitance element is connected to the oscillating circuit.

In the fifth embodiment, the oscillator 3 includes an external-voltage-control-type variable-capacitance element (e.g., a varactor diode) 22, as shown in FIGS. 11 and 12, as an element for controlling the oscillation frequency of the oscillating circuit 3. The variable capacitance element 22 varies in capacitance in accordance with an externally-applied voltage, and herein takes the form of a surface-mounted chip component, which is mounted on the substrate 2 by using bumps. In the example shown in FIG. 11, the variable capacitance element 22 is connected to one end of the inter-gate/source slot line 4gs. Further, in the example shown in FIG. 12, the variable capacitance element 22 is connected to a stub 4sv extending from the inter-gate/drain slot line 4gd.

In this manner, providing the slot line 4 of the oscillating circuit 3 with the variable capacitance element 22 causes the capacitance thereof to affect the oscillation frequency of the oscillating circuit 3. Thus, variably controlling the capacitance of the variable capacitance element 22 by external voltage control allows for external variable control of the oscillation frequency of the oscillating circuit 3.

When the variable capacitance element 22 is provided, an electrode 6q is formed on the substrate 2 to externally apply a control voltage to the variable capacitance element 22. In the configuration shown in FIG. 12, the provision of the variable capacitance element 22 may reduce the Q-factor, and thus may adversely affect the oscillating circuit 3. To prevent this, the variable capacitance element 22 should be made electrically invisible when viewed from the inter-gate/drain slot line 4gd. Thus, the line width of a part of the slot line 4 between the inter-gate/drain slot line 4gd and the variable capacitance element 22 is reduced to weaken the coupling between the inter-gate/drain slot line 4gd and the variable capacitance element 22.

A sixth embodiment of the present invention will now be described. In the description of the sixth embodiment, similar elements as those in the embodiments discussed above are denoted with the same reference numerals and the descriptions thereof are omitted.

Figure 13:
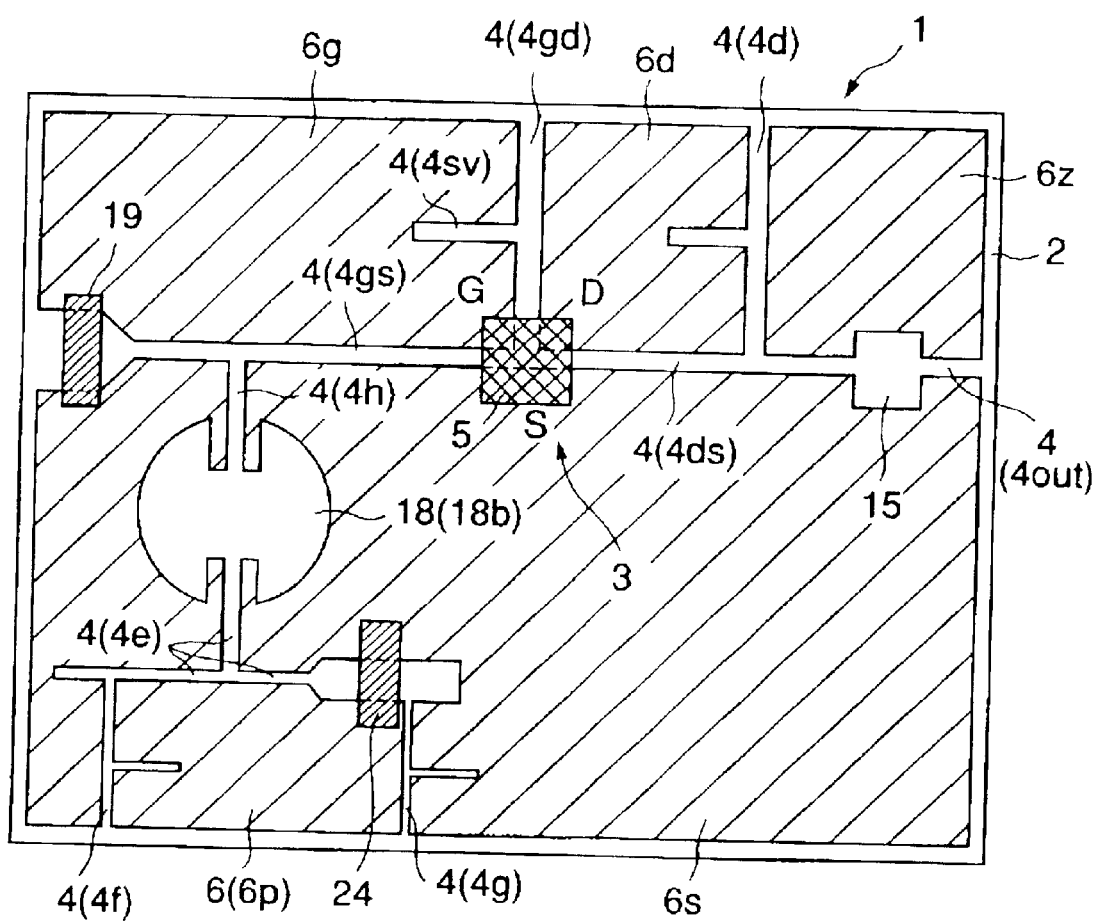
FIG. 13 is a plan view illustrating one example in which a resonator is connected to the oscillating circuit.

In the sixth embodiment, in addition to the configuration shown in the third embodiment (i.e., the configuration of the oscillator 1 with the resonator 18), an external-voltage-control-type variable-capacitance element (e.g., a varactor diode) 24 is provided to adjust the resonant frequency of the resonator 18, as exemplified in FIG. 13.

That is, the resonator 18 is connected to a slot line 4 (4h) for connecting the resonator 18 to the oscillating circuit 3 and also is connected to a slot line 4 (4e) located at a position different from the connection position of the slot line 4 (4h). The slot line 4 (4e) is connected to a variable capacitance element 24. This variable capacitance element 24 is a surface-mounted chip component, which is mounted on the substrate 2 by using bumps. Since the capacitance of the variable capacitance element 24 affects the resonant frequency of the resonator 18, variably controlling the capacitance of the variable capacitance element 24 allows for variable control of the resonant frequency of the resonator 18.

Figure 14:
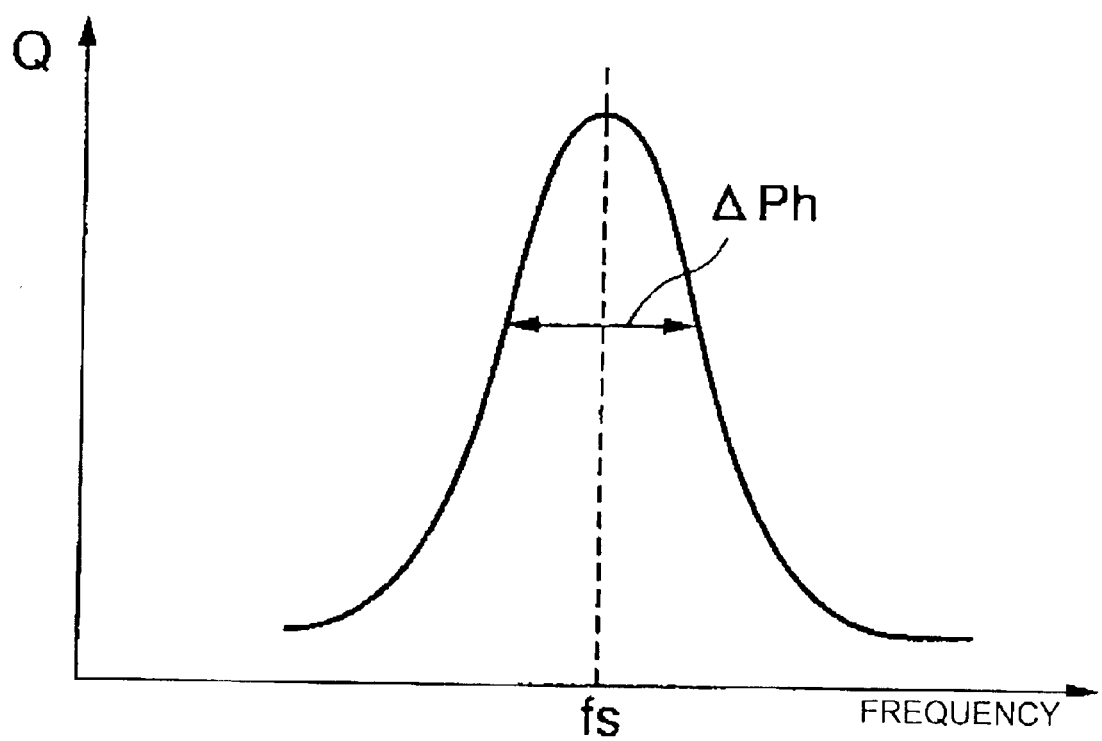
FIG. 14 is a graph illustrating the resonance characteristic of the resonator.

As described in the third embodiment, the resonator 18 can regulate the oscillation frequency of the oscillating circuit 3 within a certain frequency range. That is, when the resonator 18 is provided, the width of the oscillation frequency range of the oscillating circuit 3 is determined by the width Δ Ph of the resonant characteristic waveform of the resonator 18, as shown in FIG. 14. Also, the position of the oscillation frequency range of the oscillating circuit 3 is determined by the resonant frequency fs of the resonator 18.

For these reasons, in the sixth embodiment, the capacitance of the variable capacitance element 24 is variably controlled to vary the resonant frequency fs of the resonator 18. As a result, the position of the oscillation frequency range of the oscillating circuit 3 is shifted so that the oscillation frequency of the oscillating circuit 3 can be varied.

As in the fifth embodiment, the variable capacitance element 22 may be directly connected to the oscillating circuit 3 to variably control the oscillation frequency of the oscillating circuit 3 by variably controlling the capacitance of the variable capacitance element 22. In this case, however, when the resonator 18 is connected to the oscillating circuit 3 to enhance the stability of the oscillation frequency of the oscillating circuit 3, the oscillation frequency of the oscillating circuit 3 can be varied only within a frequency range that is determined by the resonator 18.

In contrast, in the sixth embodiment, since the position of the oscillation frequency range of the oscillating circuit 3 can be varied, the resonator 18 can enhance the stability of the oscillation frequency of the oscillating circuit 3 and can also vary the oscillation frequency of the oscillation circuit 3 by a large degree.

When the variable capacitance element 24 is provided, an electrode 6p is formed on the substrate 2 to externally apply a control voltage to the variable capacitance element 24. Also, slot lines 4f and 4g, shown in FIG. 13, each serve as a line for blocking direct current.

In addition, while FIG. 13 illustrates an example in which the variable capacitance element 24 is connected to the reactive TE010-mode plate resonator 18b shown in FIG. 7, the resonator 18 to which the variable capacitance element 24 is connected is not particularly limited. Thus, the variable capacitance element 24 may be connected to a resonator having another configuration through the slot line 4 in the same manner as in the sixth embodiment. Examples of the resonator include a reflective TE010-mode plate resonator 18a as shown in FIG. 6, a transmission slot resonator 18c as shown in FIG. 8, and a reflective slot resonator 18d as shown in FIG. 9.

Additionally, the variable capacitance element 22 for variably controlling, in a direct manner, the oscillation frequency of the oscillating circuit 3 shown in the fifth embodiment may be provided as well as the variable capacitance element 24 for variably controlling the resonant frequency of the resonator 18 shown in the sixth embodiment. In this a case, the variable capacitance element 24 for variably controlling the resonant frequency of the resonator 18 can serve to make a coarse adjustment of the oscillation frequency of the oscillating circuit 3, and the variable capacitance element 22 can serve to make a fine adjustment of the oscillation frequency of the oscillating circuit 3. This, therefore, can achieve high-accuracy variable control of the oscillation frequency of the oscillating circuit 3.

In addition, the wide portions 17 shown in the second embodiment and/or the outputting coplanar line 20 shown in the fourth embodiment may also be added to the configuration shown in the sixth embodiment.

A seventh embodiment of the present invention will now be described. In the description of the seventh embodiment, similar elements as those in the embodiments discussed above are denoted with the same reference numerals and the descriptions thereof are omitted.

Figure 15A:
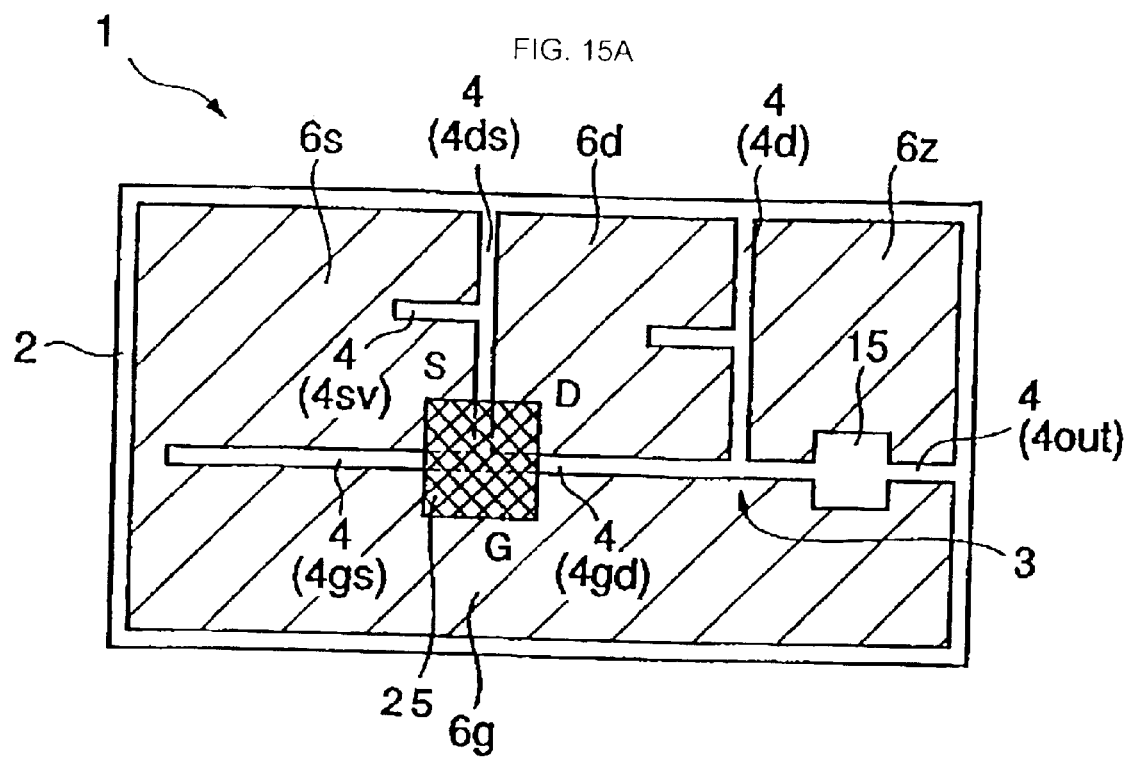
FIG. 15A is a plan view of one example in which a common-gate FET is provided instead of the common-source FET and FIG. 15B is a circuit diagram thereof.

In each of the first to sixth embodiments, an example using the common-source FET 5 has been illustrated. However, in the seventh embodiment, as shown in FIG. 15A, a common-gate FET 25 is provided instead of the common-source FET 5. FIG. 15A illustrates an example in which a configuration (in which the common-source FET 5 is replaced by the common-gate FET 25) specific to the seventh embodiment is applied to the configuration shown in the first embodiment. However, naturally, the configuration specific to the seventh embodiment may also be applied to the configuration shown in each of the second to sixth embodiments.

Figure 15B:
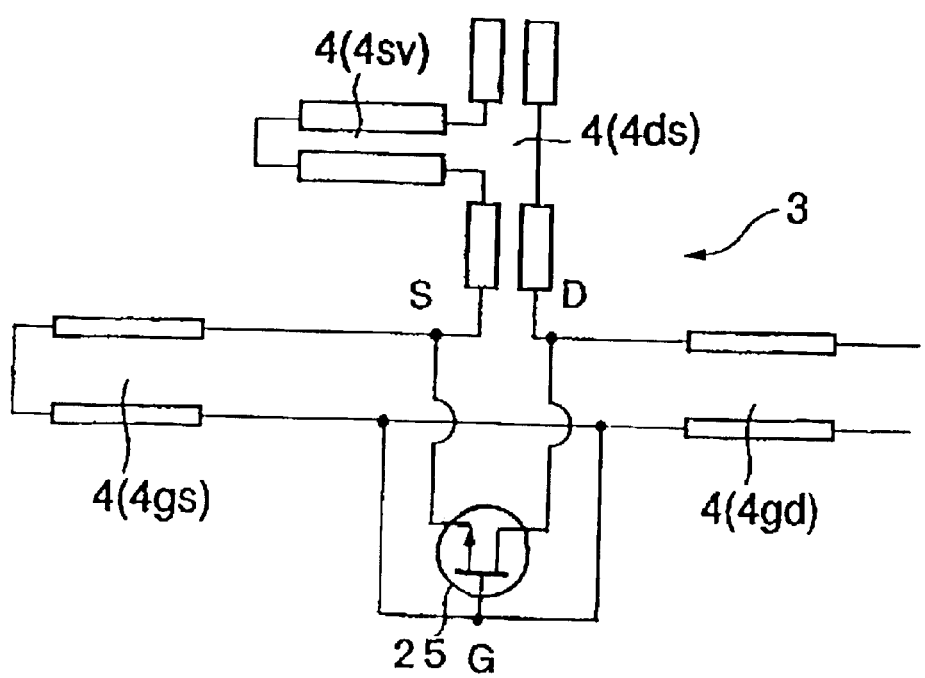

The location of the gate G of the common-gate FET 25 corresponds to the location of the source S of the common-source FET 5, and the location of the source S of the common-gate FET 25 corresponds to the location of the gate G of the common-source FET 5. Thus, when the common-gate FET 25 is provided instead of the common-source FET 5, the gate-connecting electrode 6g shown in each of the first to sixth embodiments serves as the source-connecting electrode 6s and the source-connecting electrode 6s shown in each of the first to sixth embodiments serves as the gate-connecting electrode 6g. Further, the inter-gate/drain slot line 4gd shown in each of the first to sixth embodiments serves as the inter-drain/source slot line 4ds, and the inter-drain/source slot line 4ds shown in each of the first to sixth embodiments serves as the inter-gate/drain slot line 4gd. FIG. 15B is a circuit diagram of the oscillating circuit 3 when the common-gate FET 25 is provided instead of the common-source FET 5.

In the seventh embodiment, the inter-gate/source slot line 4gs serves as a line for inputting a signal to the FET 25. When a signal is input from the inter-gate/source slot line 4gs to the FET 25, the signal is amplified by the operation of the FET 25. The amplified signal is output from the FET 25 through the inter-gate/drain slot line 4gd and is then output from the outputting slot 4out to the outside. The output signal is partly fed back as an input signal to the FET 25 by using coupling between the drain-connecting electrode 6d and the source-connecting electrode 6s. In the seventh embodiment, the inter-drain/source slot line 4ds provides a feedback-amount controlling portion for determining the amount of feedback.

In the seventh embodiment, the common-gate FET 25 is used as described above. When the common-gate FET 25 is provided, due to the structure of the common-gate FET 25, the capacitance between the drain-connecting electrode 6d and the source-connecting electrode 6s, which is one factor that determines the amount of feedback, can be made smaller than the capacitance between the gate-connecting electrode 6g and the drain-connecting electrode 6d when the common-source FET 5 is provided. This, therefore, reduces the bias dependence of the feedback circuit, which can stabilize the feedback circuit and can improve the oscillatory state of the oscillating circuit 3.

In addition, the common-gate FET 25 generally has a high reflection gain compared to the common-source FET 5. When the resonator 18 is connected to the oscillating circuit 3, the use of the common-gate FET 25 allows the oscillating circuit 3 to be oscillated even when the coupling between the resonator 18 and the oscillating circuit 3 is weakened, due to a high reflection gain of the common-gate FET 25. When the coupling between the resonator 18 and the oscillating circuit 3 is weakened, the influence exerted onto the oscillating circuit 3 by the resonator 18 is reduced. Thus, the resonator 18 can be designed without much concern about the influence exerted onto the oscillating circuit 3 by the resonator 18. That is, the freedom in designing the resonator 18 can be enhanced, which thus facilitates the design of the resonator 18 such that the Q-factor can be further improved. This arrangement, therefore, can improve the Q-factor of the resonator 18 and can further enhance the Q-factor of the oscillator 1, which makes it possible to provide an oscillator 1 having reduced phase noise.

An eighth embodiment of the present invention will now be described. The eighth embodiment is directed to a communication apparatus. The communication apparatus of the eighth embodiment is characterized in that it includes the oscillator 1 having the configuration of one of the first to seventh embodiments. Since the configuration of the oscillator 1 has been discussed above, the description thereof is omitted. Also, various configurations are available for elements other than the oscillator 1 in the communication apparatus. In this case, any configurations may be employed for the elements other than the oscillator 1, and the descriptions thereof will be omitted.

In the eighth embodiment, the use of the oscillator 1 shown in each of the first to seventh embodiments allows a communication state to be stabilized and allows the reliability of the communication to be enhanced.

The present invention is not limited to the configuration of each of the first to eighth embodiments, and can take various forms. For example, while the FET 5 or 25 is provided as an amplifying element for the oscillating circuit 3 in each of the first to eighth embodiments, a bipolar transistor, such as an HBT (heterojunction bipolar transistor), may be provided instead of the FET 5 or 25. Since a bipolar transistor can facilitate a reduction in phase noise compared to an FET, a bipolar transistor can advantageously be used when it is desired to reduce, mainly, the phase noise.

In addition, in the second embodiment, while wide portions 17 are provided at parts of the inter-gate/source slot line 4gs and the inter-drain/source slot line 4ds, respectively, the wide portion 17 may be provided at either slot line 4.

Additionally, the pattern of each slot line 4 shown in the FIGS. 1, 5 to 13, and 15 is one example, and the pattern thereof can take any form. For example, multiple types of FET, such as a common-drain type, are available, and the pattern of the slot line 4 is designed by considering the type of FET.

In addition, while the resonator is formed of a conductor pattern in each of the third to eighth embodiments, a resonator in the form of a surface-mounted chip component may be provided when a resonator having an increased size is allowed and/or only a low performance is required.

Additionally, while the oscillator 1 is exemplified as a high-frequency circuit device in each of the first to eighth embodiments, the high-frequency circuit device of the present invention is also applicable to high-frequency circuit devices, such as amplifiers and switching circuit devices, as well as oscillators. Even in an amplifier or a switching circuit device, the use of the slot line as a signal line can reduce the conduction loss and also the use of a dielectric substrate can reduce the dielectric loss. As a result, a circuit having a high Q-factor can be configured and the phase noise can be reduced.

What is claimed is:

1. A high-frequency circuit device comprising:
   a substrate;
   an oscillating circuit provided on the substrate, the oscillating circuit having a signal line; and
   a semiconductor element serving as an amplifying element being provided with the signal line, said amplifying element comprising a common-source field effect transistor;
   wherein a gate-connecting electrode, which is connected to the gate of the field effect transistor, a drain-connecting electrode, which is connected to the drain of the field effect transistor, and a source-connecting electrode, which is connected to the source of the field effect transistor, are provided on the substrate,
   said signal line comprises an inter-gate/drain slot line in which the gate-connecting electrode and the drain-connecting electrode are arranged side-by-side with a space therebetween, an inter-gate/source slot line in which the gate-connecting electrode and the source-connecting electrode are arranged side-by-side with a space therebetween, and an inter-drain/source slot line in which the drain-connecting electrode and the source-connecting electrode are arranged side-by-side with a space therebetween,
   the inter-gate/drain slot line, the inter-gate/source slot line, and the inter-drain/source slot line are interconnected at a region where the field effect transistor is mounted, and constitute a feedback circuit, in which a signal output from the field effect transistor to the inter-drain/source slot line is partly fed back as an input signal to the field effect transistor via the inter-gate/source slot line by using coupling between the gate-connecting electrode and the drain-connecting electrode, and
   the inter-gate/drain slot line defines a feedback-amount controlling section for determining an amount of feedback for the feedback circuit by specifying the degree of coupling between the gate-connecting electrode and the drain-connecting electrode.

2. A high-frequency circuit device according to claim 1, wherein the slot line through which a high-frequency signal is transmitted comprises a wide portion for reducing conduction loss.

3. A high-frequency circuit device according to claim 1, wherein the slot line that defines the feedback-amount controlling section in the feedback circuit has a short stub provided at a position of about λ/4 from a portion where the inter-gate/drain slot line, the inter-gate/source slot line, and the inter-drain/source slot line are interconnected.

4. A high-frequency circuit device according to claim 1, wherein a resonator connected to the oscillating circuit for stabilizing the oscillation frequency of the oscillating circuit is provided on the substrate.

5. A high-frequency circuit device according to claim 1, wherein an external-voltage-control-type variable-capacitance element as an element for controlling the oscillation frequency of the oscillating circuit is provided in the oscillating circuit.

6. A high-frequency circuit device according to claim 4, further comprising an external-voltage-control-type variable-capacitance element, which is connected to the resonator connected to the oscillating circuit, for variably controlling the resonant frequency of the resonator.

7. A high-frequency circuit device according to claim 1, wherein the semiconductor element comprises a bipolar transistor.

8. A high-frequency circuit device according to claim 1, wherein the substrate comprises dielectric material and has an f×Q-factor of 50000 or greater, where the f×Q-factor is determined from multiplying the frequency f of a high-frequency signal passing through the high-frequency circuit by the inverse Qd of the dielectric loss tan δ of the substrate.

9. A communication apparatus comprising a high-frequency circuit device according to claim 1.

10. A high-frequency circuit device comprising:

a substrate;

an oscillating circuit provided on the substrate, the oscillating circuit having a signal line; and a semiconductor element serving as an amplifying element being provided with the signal line, said amplifying element comprising a common-source field effect transistor;

wherein a gate-connecting electrode, which is connected to the gate of the field effect transistor, a drain-connecting electrode, which is connected to the drain of the field effect transistor, and a source-connecting electrode, which is connected to the source of the field effect transistor, are provided on the substrate, said signal line comprises an inter-gate/drain slot line in which the gate-connecting electrode and the drain-connecting electrode are arranged side-by-side with a space therebetween, an inter-gate/source slot line in which the gate-connecting electrode and the source-connecting electrode are arranged side-by-side with a space therebetween, and an inter-drain/source slot line in which the drain-connecting electrode and the source-connecting electrode are arranged side-by-side with a space therebetween, the inter-gate/drain slot line, the inter-gate/source slot line, and the inter-drain/source slot line are interconnected at a region where the field effect transistor is mounted, and constitute a feedback circuit, in which a signal output from the field effect transistor to the inter-gate/drain slot line is partly fed back as an input signal to the field effect transistor via the inter-gate/source slot line by using coupling between the drain-connecting electrode and the source-connecting electrode, and the inter-drain/source slot line defines a feedback-amount controlling section for determining an amount of feedback for the feedback circuit by specifying the degree of coupling between the drain-connecting electrode and the source-connecting electrode.

11. A high-frequency circuit device according to claim 10, wherein the slot line through which a high-frequency signal is transmitted comprises a wide portion for reducing conduction loss.

12. A high-frequency circuit device according to claim 10, wherein the slot line that defines the feedback-amount controlling section in the feedback circuit has a short stub provided at a position of about λ/4 from a portion where the inter-gate/drain slot line, the inter-gate/source slot line, and the inter-drain/source slot line are interconnected.

13. A high-frequency circuit device according to claim 10, wherein a resonator connected to the oscillating circuit for stabilizing the oscillation frequency of the oscillating circuit is provided on the substrate.

14. A high-frequency circuit device according to claim 10, wherein an external-voltage-control-type variable-capacitance element as an element for controlling the oscillation frequency of the oscillating circuit is provided in the oscillating circuit.

15. A high-frequency circuit device according to claim 13, further comprising an external-voltage-control-type variable-capacitance element, which is connected to the resonator connected to the oscillating circuit, for variably controlling the resonant frequency of the resonator.

16. A high-frequency circuit device according to claim 10, wherein the semiconductor element comprises a bipolar transistor.

17. A high-frequency circuit device according to claim 10, wherein the substrate comprises dielectric material and has an f×Q-factor of 50000 or greater, where the f×Q-factor is determined from multiplying the frequency f of a high-frequency signal passing through the high-frequency circuit by the inverse Qd of the dielectric loss tan δ of the substrate.

18. A communication apparatus comprising a high-frequency circuit device according to claim 10.

* * * * *